(12) United States Patent
Asakura et al.

(10) Patent No.: US 8,581,626 B2
(45) Date of Patent: Nov. 12, 2013

(54) CONTROL SYSTEM, LOGIC MODULE SUBSTRATE, AND LOGIC FPGA

(75) Inventors: Yoshihiro Asakura, Chiba (JP); Hiroshi Nagahisa, Tokyo (JP); Hidemitsu Hohki, Tokyo (JP); Atsushi Takahashi, Tokyo (JP); Yukitaka Yoshida, Tokyo (JP); Yuji Ichioka, Tokyo (JP); Mamoru Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/218,139

(22) Filed: Aug. 25, 2011

(65) Prior Publication Data

US 2013/0049803 A1 Feb. 28, 2013

(51) Int. Cl.
*H03K 19/177* (2006.01)
*G06F 17/50* (2006.01)

(52) U.S. Cl.
USPC ............... 326/39; 326/38; 716/111; 716/138

(58) Field of Classification Search
USPC ............... 326/38–41; 716/111, 138
See application file for complete search history.

(56) References Cited

U.S. PATENT DOCUMENTS 6,308,311 B1 * 10/2001 Carmichael et al. ......... 716/117
6,560,665 B1 *  5/2003 Resler et al. ................. 710/305
6,760,898 B1 *  7/2004 Sanchez et al. .............. 716/111
6,924,663 B2 *  8/2005 Masui et al. ................... 326/38
7,519,879 B2 *  4/2009 Woodward et al. .......... 714/724
2002/0194543 A1 * 12/2002 Veenstra et al. ................ 714/39
2003/0097615 A1 *  5/2003 Corti et al. ..................... 714/37
2003/0110429 A1 *  6/2003 Bailis et al. ................... 714/725
2004/0225783 A1 * 11/2004 Erickson et al. .............. 710/200

FOREIGN PATENT DOCUMENTS

JP     09-311162 A    12/1997
JP     11-344542 A    12/1999
JP   2000-138272 A     5/2000
JP   2001-228215 A     8/2001

* cited by examiner

*Primary Examiner* — Shawki Ismail
*Assistant Examiner* — Dylan White
(74) *Attorney, Agent, or Firm* — Foley & Lardner LLP

(57) ABSTRACT

According to an embodiment, a control system has: a logic module substrate that has a logic FPGA on which logic is mounted, a transmission module that transmits an output logic state signal, which is logic state signal representing an interim logic state of a process by the logic FPGA of deriving a logic output signal from the logic input signals, and a logic monitoring device that displays to monitor the logic state signal transmitted from the transmission module. The logic module substrate includes an event detection unit that detects a change in the logic state signal. Only when a change in the logic state signals is detected by the event detection unit, the logic output state signal being transmitted to the transmission module.

5 Claims, 3 Drawing Sheets

CONTROL SYSTEM, LOGIC MODULE SUBSTRATE, AND LOGIC FPGA

FIELD

Embodiments described herein relate generally to a control system, a logic module substrate used in the control system, and an FPGA (Field Programmable Gate Array) for logic.

BACKGROUND

A safety protection system, which controls a safety function of a nuclear power plant, has conventionally used mainly a controller of a CPU (Central Processing Unit) type. However, in recent years, in terms of diversification, an FPGA-type controller, which uses an FPGA that is a programmable element, has been also used.

In the CPU-type controller, a monitoring personal computer communicates with a CPU, making it possible to monitor the states of logic inputs, outputs and interim values. However, since the FPGA-type controller has a hardware circuit structure containing logic, it is not possible to monitor a logic state in the same way as the CPU-type controller.

In particular, it is hoped that a method of correctly recognizing actual states, including interim values, of logic will be established in an essential system such as the safety protection system of the nuclear power plant. A technique for taking a logic state signal out of the FPGA-type controller to monitor is disclosed in Jpn. Pat. Appln. Laid-Open Publication No. 09-311162 and in U.S. Pat. No. 6,760,898, the entire contents of which are incorporated herein by reference.

According to the technique disclosed in the above documents, it is possible to monitor interim values of logic of the FPGA-type controller. However, a large communication load is placed on a monitoring device because a logic state signal of the logic is constantly taken out and monitored.

The object of the present invention is to make it possible for a control system that uses an FPGA to monitor actual logic states, including logic interim values, during operation or inspection with a small communication load.

DETAILED DESCRIPTION

Hereinafter, with reference to the accompanying drawings, embodiments of a control system of the present invention will be described. Portions that are the same as or similar to each other are denoted by the same reference symbols, and will not be described repeatedly.

First Embodiment

Figure 1:
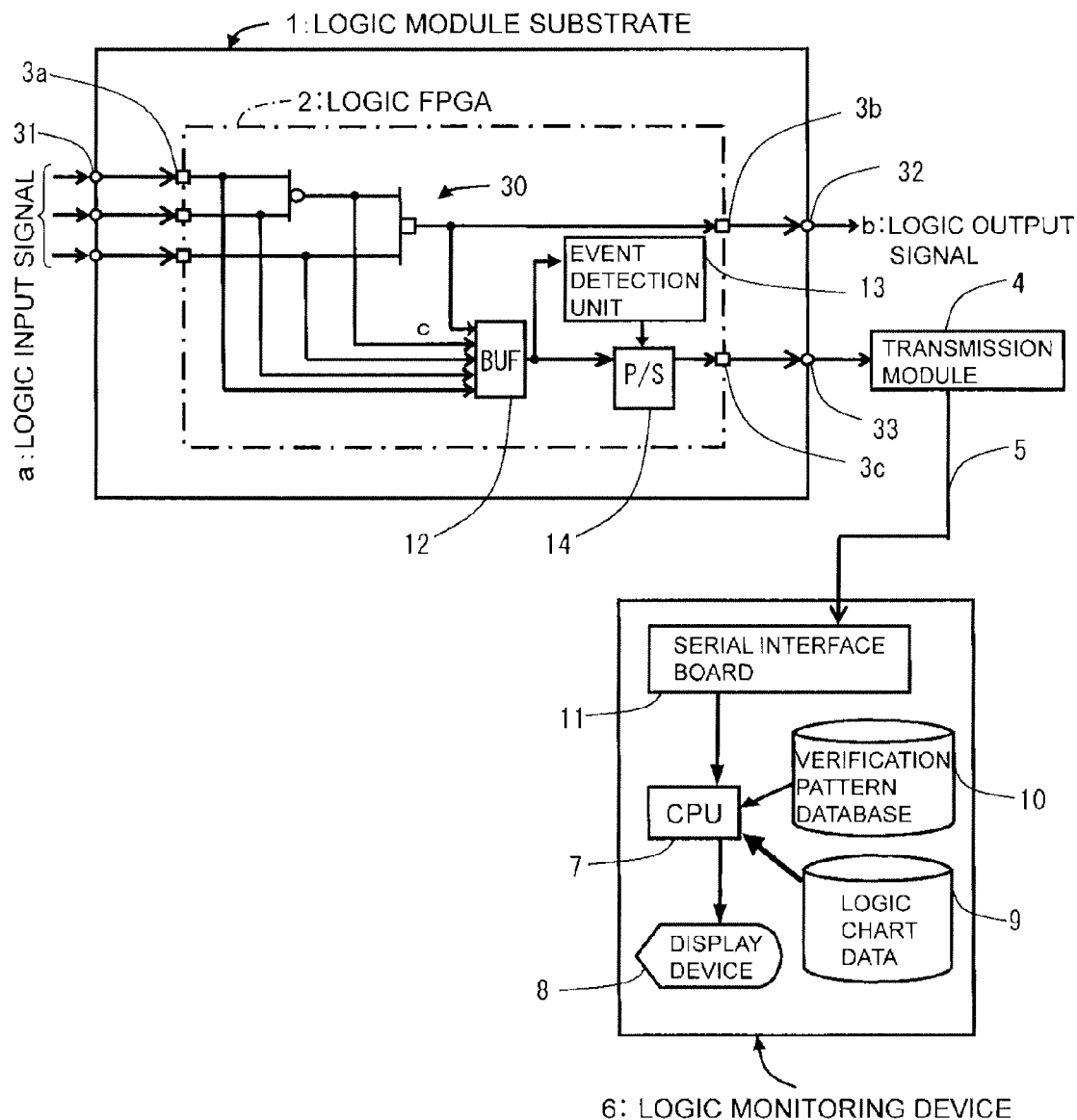
FIG. 1 is a block diagram schematically showing the configuration of a control system according to a first embodiment.

FIG. 1 is a block diagram schematically showing the configuration of a control system according to a first embodiment of the present invention.

The control system is for example a safety protection control system that controls a safety function of a nuclear power plant or the like. The control system processes the logic input signals and outputs a logic output signal "b". A logic FPGA 2 is mounted on a logic module substrate 1.

In the logic FPGA 2, a logic circuit 30 is formed. The logic input signals "a" are input from input terminals 31 of the logic module substrate 1, and then input to the logic FPGA 2 from the FPGA input pins 3a. The logic output signal "b", which is a result of processing by the logic circuit 30, is output from an FPGA output pin 3b, and then output to the outside of the logic module substrate 1 from an output terminal 32 of the logic module substrate 1. The output signal "b" is used in controlling a plant (not shown) and other processes.

Furthermore, in the logic FPGA 2, the following are formed: a buffer memory (BUF) 12, which receives in parallel the logic state signals "c", which represent logic states of the logic circuit 30, from the middle of the logic circuit 30 and temporarily stores the logic state signals "c"; an event detection unit 13, which detects a change in the logic state signals "c" output from the buffer memory 12; and a parallel/serial conversion unit (P/S) 14, which converts, when a change in the logic state signals "c" is detected by the event detection unit 13, the logic state signals "c" to a serial data, and outputs the serial data.

Incidentally, as shown in the example of FIG. 1, the logic state signals "c" may include the equivalent of the logic input signals "a" or logic output signal "b".

The output of the parallel/serial conversion unit 14 is transmitted from an FPGA logic state output pin 3c to a transmission module 4, which is outside the module substrate 1, via an output terminal 33 of the logic module substrate 1. The transmission module 4 has an electricity/light conversion function to convert electric signals to optical signals. An optical signal obtained by the transmission module 4 is transmitted to a logic monitoring device 6 via an optical transmission cable 5.

The logic monitoring device 6 includes a serial interface board 11, a CPU (Central Processing Unit) 7, a display device 8, a verification pattern database (DB) 10, and logic chart data 9.

What is stored in the verification pattern database 10 is a data corresponding to an output prediction result, which is estimated in response to patterns of the logic input signals "a" of the logic circuit 30 at a time when the logic FPGA is in a normal state. The optical signal, which is transmitted by the optical transmission cable 5 from the transmission module 4, is received by the serial interface board 11 of the logic monitoring device 6.

The following describes an operation of the first embodiment.

Without interference from the logic monitoring device 6 or the like, the logic circuit 30 in the FPGA 2 outputs the logic output signal "b" after processing the logic input signals "a". Meanwhile, the logic state signals "c", which represents a logic state of the logic circuit 30, is temporarily stored in the buffer memory 12 inside the FPGA 2 before being output to the parallel/serial conversion unit 14. Only when a change of the logic state signals "c" are detected by the event detection unit 13, the parallel/serial conversion unit 14 converts the logic state signals "c" to a serial data, and outputs the serial data as an output logic state signal via the logic state output pin 3c and then the output terminal 33 of the logic module substrate 1. The output logic state signal output from the output terminal 33 remains an electric signal when the output logic state signal is transmitted to the transmission module 4.

In the transmission module 4, the output logic state signal as the electric signal is converted into an optical signal, which is then transmitted by the optical transmission cable 5 to the serial interface board 11 of the logic monitoring device 6.

In the logic monitoring device 6, the output logic state signal received from the serial interface board 11 becomes associated with the logic chart data 9 in the CPU 7; an ON/OFF state of a logic line is displayed on the display device 8. In this case, the logic line displayed on the display device 8 is, for example, designed to show a portion of the logic circuit 30 shown in FIG. 1 as an image. For example, varying types of the logic line in color, thickness or the like enable an ON state and an OFF state to be identified when being displayed.

Furthermore, the CPU 7 compares the output prediction result, which is patterned in advance in the verification pattern database 10, with the actual output logic state signal. The CPU 7 determines that a malfunction has occurred when there is a difference between the output prediction result and the output logic state signal. The display device 8 displays the fact that a malfunction has occurred at a time when is determined by the CPU 7 that the malfunction occurs.

As described above, according to the first embodiment, data are transmitted only when there is a change in the logic value. Therefore, it is possible to keep a communication load placed on the monitoring device small.

The logic state inside the logic FPGA 2 is monitored, and the logic state is expressed as a logic chart on the screen. Thus, the logic state inside the logic FPGA can be recognized visually and accurately by the operator.

Moreover, it is possible to separate the logic FPGA 2 from the logic monitoring device 6 electrically. Therefore, it is possible to avoid the effects of a logic malfunction at a time when the logic monitoring device 6 breaks down. The above advantage is important particularly in a control system that requires high reliability, such as a safety protection system that controls a nuclear safety function.

Furthermore, in the first embodiment, not only the logic state is simply monitored, but an actual input state is compared with the verification pattern DB to make a determination as to whether the state of an output, which is a logic result, is correct. Therefore, it is possible to detect a logic malfunctioning state, allowing immediate discovery of malfunctioning parts.

Incidentally, in the example shown in FIG. 1, for one logic module substrate 1, one transmission module 4 and one logic monitoring device 6 exist. However, for a plurality of logic module substrates 1, one transmission module 4 and one logic monitoring device 6 may exist. Alternatively, for one logic module substrate 1, a plurality of transmission modules 4 and a plurality of logic monitoring devices 6 may exist (not shown).

Furthermore, in the example shown in FIG. 1, one logic FPGA2 is placed in one logic module substrate 1. However, a plurality of logic FPGAs 2 may be placed in one logic module substrate 1 (not shown).

Second Embodiment

Figure 2:
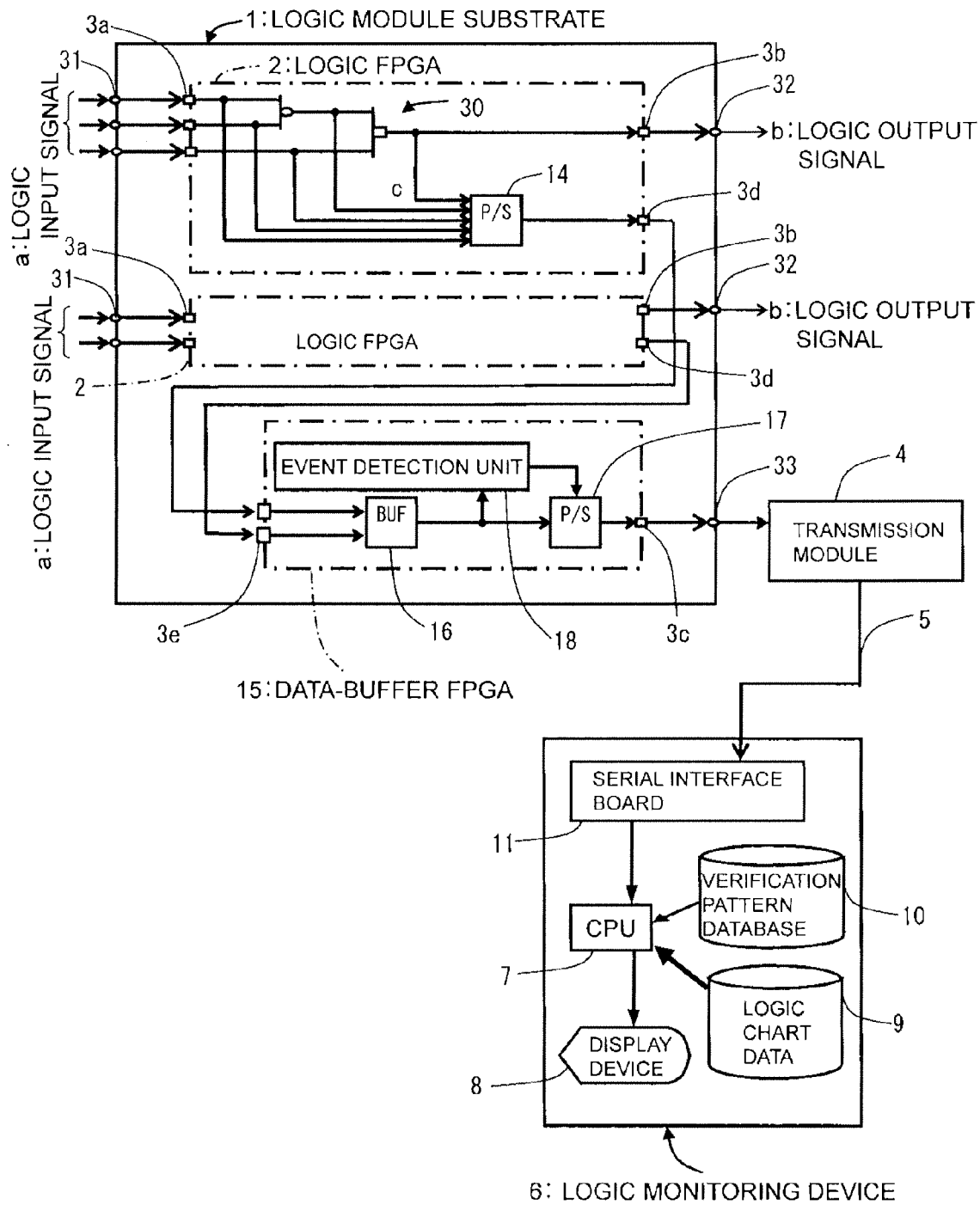
FIG. 2 is a block diagram schematically showing the configuration of a control system according to a second embodiment.

FIG. 2 is a block diagram schematically showing the configuration of a control system according to a second embodiment of the present invention.

In the present embodiment, on one logic module substrate 1, a plurality of logic FPGAs 2 and one data-buffer FPGA 15 are mounted. In each of the logic FPGAs 2, the logic circuit 30, as well as the parallel/serial conversion units 14, are formed. The parallel/serial conversion unit 14 receive in parallel the logic state signals "c" from the middles of the logic circuits 30 and convert the logic state signals "c" to serial data.

In FIG. 2, the internal configuration of only one logic FPGA 2 is shown, while the internal configurations of other logic FPGAs 2 are not shown. However, the internal configurations are the same except for the configurations of the logic circuits 30.

The following are formed in the data-buffer FPGA 15: a buffer memory 16, into which the output logic state signal outputs from parallel/serial conversion units 14 of a plurality of logic FPGAs 2 via FPGA logic state output pins 3*d* of the logic FPGAs 2 are input via an FPGA logic state input pin 3*e* and which temporarily stores the logic state signal; an event detection unit 18, which detects a change in the output logic state signals "c" output from the buffer memory 16; and a parallel/serial conversion unit 17, which converts, when a change in the output logic state signals are detected by the event detection unit 18, the output logic state signals "c" to serial data, and outputs the serial data.

Incidentally, the second embodiment is different from the first embodiment in that an event detection unit and a parallel/serial conversion unit do not exist in the logic FPGAs 2.

An output from the parallel/serial conversion unit is transmitted to a transmission module 4 as an electric signal via an FPGA logic state output pin 3*c* and an output terminal 33 of the logic module substrate 1. The transmission module 4 is connected to a logic monitoring device 6 through an optical transmission cable 5.

In the present embodiment, a plurality of logic module substrates 1 is connected to one logic monitoring device 6 via one transmission module 4.

The configurations and functions of the transmission module 4 and logic monitoring device 6 are the same as those in the first embodiment (FIG. 1).

The following describes an operation of the second embodiment.

In the above-described first embodiment, the logic and the data-buffer function exist in the same FPGA. However, according to the second embodiment, the data-buffer function and the logic are separately formed in different FPGAs. In this manner, a logic monitoring function is realized.

The parallel/serial conversion unit 14 of each of the logic FPGAs 2 converts the logic state signals "c" of the logic circuit 30 to a serial data, and outputs the serial data as an output logic state signal via an FPGA logic state output pin 3*d*. The output logic state signals output from the FPGA logic state output pins 3*d* of the logic FPGAs 2 are input into the buffer memory 16 of the data-buffer FPGA 15 via an FPGA logic state input pin 3*e* of the data-buffer FPGA 15, stored in the buffer memory 16 of the data-buffer FPGA 15 temporarily. Only when a change in the logic state signals "c" is detected by the event detection unit 18, the parallel/serial conversion unit 17 of the data-buffer FPGA 15 converts the output logic state signals to a serial data, and outputs the serial data to the transmission module 4.

According to the second embodiment, in addition to the advantageous effects of the first embodiment, it is possible to increase a logic capacity that can be incorporated into the logic FPGAs 2 because the logic FPGAs 2 can be separated from the data-buffer FPGA 15.

Moreover, logic state display signals of a plurality of logic FPGAs 2 can be put together in one data-buffer FPGA 15. Therefore, it is possible to improve the efficiency in the mounting of the logic module substrates 1.

Moreover, FPGAs of logic processing units and data-buffer processing units are separated. Therefore, it is possible to reduce the effects of a logic malfunction at a time when the data-buffer processing units break down.

Incidentally, in a modified example of the second embodiment, instead of a plurality of logic FPGAs 2, only one logic FPGA 2 may be mounted on one logic module substrate 1.

Furthermore, in a modified example of the second embodiment, for a plurality of logic module substrates 1, one transmission module 4 and one logic monitoring device 6 may exist (not shown). Alternatively, for one logic module substrate 1, a plurality of transmission modules 4 and a plurality of logic monitoring devices 6 may exist (not shown).

Third Embodiment

Figure 3:
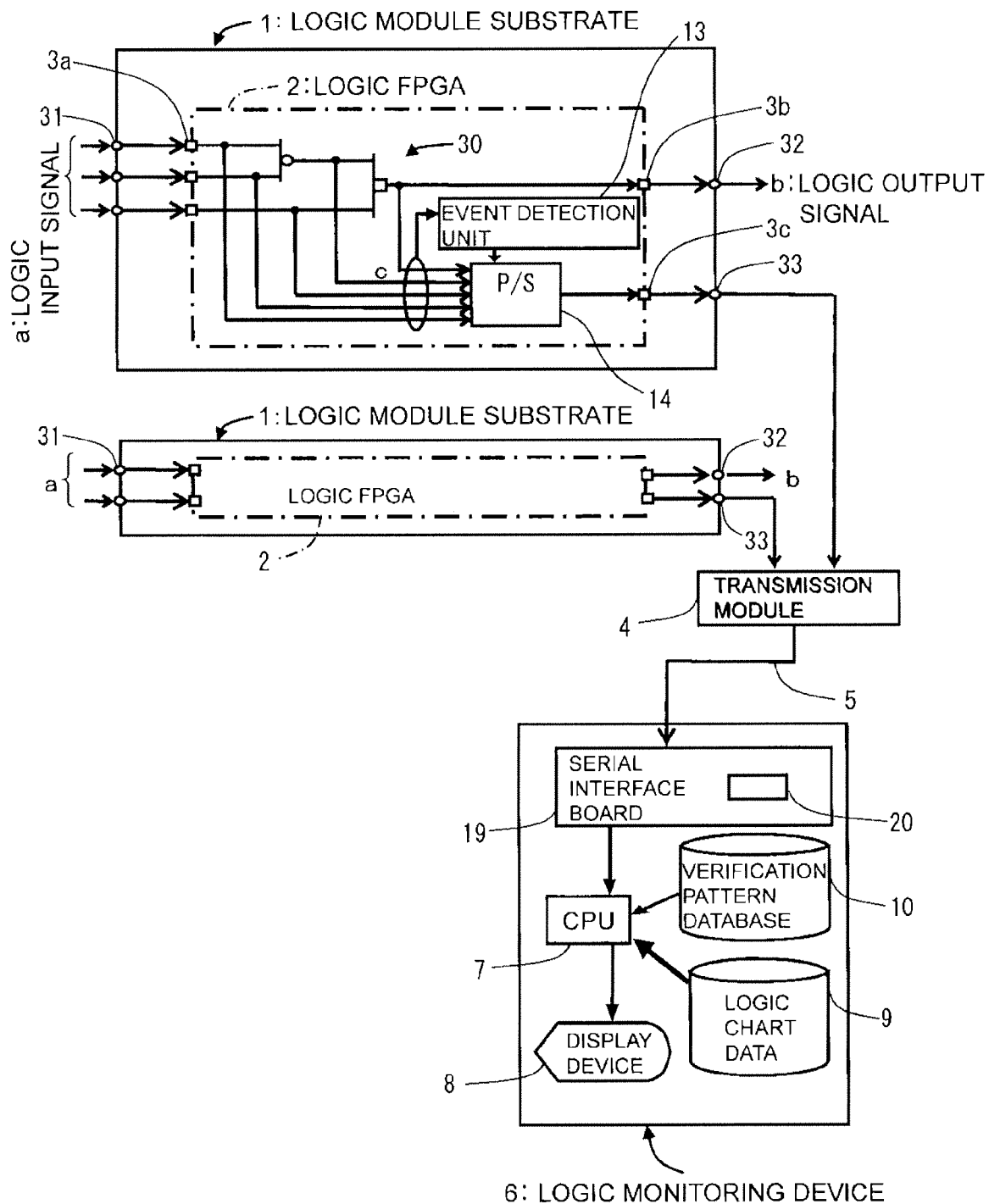
FIG. 3 is a block diagram schematically showing the configuration of a control system according to a third embodiment.

FIG. 3 is a block diagram schematically showing the configuration of a control system according to a third embodiment of the present invention.

According to the third embodiment, there are provided a plurality of logic module substrate 1, and a logic FPGA 2 is mounted on each of the logic module substrate 1. In the logic FPGA 2, a logic circuit 30, as well as the following, is formed: an event detection unit 13, which receives in parallel the logic state signals "c" from the middle of the logic circuit 30 and detects a change in the logic state signals "c" and a parallel/serial conversion unit 14, which converts, only when a change of the logic state signals "c" are detected by the event detection unit 13, parallel data to serial data and outputs the serial data.

According to the third embodiment, in the logic FPGA 2, there is nothing equivalent to the buffer memory 12 in the logic FPGA 2 of the first embodiment. Moreover, on the logic module substrate 1 of the third embodiment, there is nothing equivalent to the data-buffer FPGA 15 (FIG. 2) on the logic module substrate 1 of the second embodiment.

According to the third embodiment, a buffer memory 20 is disposed on a serial interface board 19 of a logic monitoring device 6.

According to the present embodiment, a plurality of logic module substrates 1 is connected to one logic monitoring device 6 via one transmission module 4.

The following describes an operation of the third embodiment.

According to the above-described first embodiment, the data-buffer function is attached to the logic module substrate 1. According to the third embodiment, the data-buffer function is provided in the logic monitoring device 6. In this manner, a logic monitoring function is realized.

Only when a change in the logic state signals "c" of a logic circuit 30 is detected by the event detection unit of a logic module substrate 1, the parallel/serial conversion unit 14 of a logic module substrate 1 converts a the logic state signals "c" to a serial data, and outputs the serial data as an output logic state signal via the logic state output pin 3c and then the output terminal 33 of the logic module substrate 1. The output logic state signal of the logic module substrate 1 remains an electric signal when the output logic state signals are transmitted to the transmission module 4.

The output logic state signals are converted in the transmission module 4 to an optical signal, which are transferred to a serial interface board 19 of the logic monitoring device 6 from the transmission module 4 through an optical transmission cable 5. The output logic state signals are temporarily stored in a buffer memory 20 in the serial interface board 19. The logic monitoring device 6 displays a logic state on the basis of data of the buffer memory 20.

According to the third embodiment, in addition to the advantageous effects of the first embodiment, it is possible to improve the efficiency in the mounting of the logic module substrate 1 because a data buffering process is held in the logic monitoring device 6.

The output logic state signals of a plurality of logic module substrates 1 are collectively received by one serial interface board 19. Therefore, it is possible to improve the efficiency in the mounting of the logic module substrates 1 of an entire FPGA-type controller.

Moreover, the FPGA logic is electrically separated from the data buffering process. Therefore, it is possible to avoid the effects of a logic malfunction at a time when the data buffering process goes wrong.

According to a control system of at least one embodiment described above, only when a change in the logic state signal is detected by the event detection unit, the logic state signal being transmitted to the transmission module. Therefore, it is possible for a control system to monitor actual logic states, including logic interim values, during operation or inspection with a small communication load.

Other Embodiments

The features of the first to third embodiments may be used in combination in one control system. While certain embodiments have been described, these embodiments have been presented by way of example only, and are not intended to limit the scope of the inventions. Indeed, the novel embodiments described in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the inventions.

What is claimed is:

1. A control system, comprising:
   a logic module substrate that has a plurality of logic FPGAs on each of which logic for deriving a logic output signal from the logic input signals is mounted, and a data buffer FPGA that includes a buffer memory for buffering data to temporarily store the logic output signals from the plurality of logic FPGAs;
   a transmission module that transmits to the outside of the logic module substrate output logic state signals, which are logic state signals representing interim logic states of processes by the logic FPGAs of deriving logic output signals from the logic input signals; and
   a logic monitoring device that displays to monitor the logic state signal transmitted from the transmission module, wherein
   the data buffer FPGA includes an event detection unit that detects a change in the logic state signal, only when a change in the logic state signal is detected by the event detection unit, the logic output state signal being transmitted to the transmission module.

2. A control system, comprising:
   a logic module substrate that has a logic FPGA on which logic for deriving a logic output signal from the logic input signals is mounted;
   a transmission module that transmits to the outside of the logic module substrate an output logic state signal, which is logic state signal representing an interim logic state of a process by the logic FPGA of deriving a logic output signal from the logic input signals; and
   a logic monitoring device that displays to monitor the logic state signal transmitted from the transmission module, wherein the logic module substrate includes an event detection unit that detects a change in the logic state signal, only when a change in the logic state signal is detected by the event detection unit, the logic output state signal being transmitted to the transmission module, and the logic monitoring device includes:

a CPU that compares the output prediction result, which is estimated in response to the logic input signals at a time when the logic FPGA is in a normal state, with the actual output logic state signal and determining that a malfunction has occurred when there is a difference between the output prediction result and the output logic state signal; and a display device displays the fact that a malfunction has occurred at a time when it is determined by the determination means that the malfunction has occurred.

3. The control system according to claim 1, wherein the logic monitoring device includes:

a CPU that displays logic of the logic FPGAs as a chart; and a display device displays a state of the logic depending on the output logic state signal by varying a type of each line of the chart.

4. The control system according to claim 2, wherein:

the event detection unit is mounted in the logic FPGAs; and the logic monitoring device includes a buffer memory for buffering data to temporarily store the logic state signal after receiving the output logic state signal from the transmission module.

5. A logic module substrate, comprising:

a plurality of logic FPGAs on which a logic unit, which derives a logic output signal from logic input signals, and a parallel/serial conversion unit, which receives the logic state signals representing an interim logic state of a process by the logic unit of deriving a logic output signal from the logic input signals and converts the logic state signals to serial data, and outputs the serial data as an output logic state signal, are mounted; and a data-buffer FPGA on which a buffer memory, which is for buffering data to temporarily store an output signal from the plurality of logic FPGAs after receiving the output logic state signal, an event detection unit, which detects a change in the logic state signals on the basis of the output logic state signals from the buffer memory, and a parallel/serial conversion unit, which converts the output logic state signals to a serial data only when a change in the output logic state signals are detected by the event detection unit, are mounted.

* * * * *